(12) United States Patent
Pekarik et al.

(10) Patent No.: US 12,471,294 B2
(45) Date of Patent: Nov. 11, 2025

(54) ARRAY ARRANGEMENTS OF VERTICAL BIPOLAR JUNCTION TRANSISTORS

(71) Applicant: GlobalFoundries U.S. Inc., Malta, NY (US)

(72) Inventors: John J. Pekarik, Underhill, VT (US); Hong Yu, Clifton Park, NY (US); Vibhor Jain, Essex Junction, VT (US); Alexander Derrickson, Saratoga Springs, NY (US); Venkatesh Gopinath, Fremont, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 516 days.

(21) Appl. No.: 17/990,800

(22) Filed: Nov. 21, 2022

(65) Prior Publication Data
US 2024/0172455 A1    May 23, 2024

(51) Int. Cl.
*H10B 63/00*    (2023.01)
*H10D 10/01*    (2025.01)
*H10D 10/80*    (2025.01)
*H10N 70/00*    (2023.01)

(52) U.S. Cl.
CPC ............ *H10B 63/32* (2023.02); *H10D 10/021* (2025.01); *H10D 10/821* (2025.01); *H10N 70/011* (2023.02); *H10N 70/826* (2023.02)

(58) Field of Classification Search
CPC .... H10B 63/32; H10N 70/826; H10N 70/011; H10D 10/821; H10D 10/021
USPC .......................................................... 257/2
See application file for complete search history.

(56) References Cited

U.S. PATENT DOCUMENTS

| | | | |
|---|---|---|---|
| 8,687,403 | B1 | 4/2014 | Derhacobian |
| 9,991,368 | B2 | 6/2018 | Ting et al. |
| 10,115,810 | B2 | 10/2018 | Liu et al. |
| 10,916,642 | B2 | 2/2021 | Jain et al. |
| 2005/0169043 | A1 | 8/2005 | Yokoyama et al. |
| 2006/0289942 | A1 | 12/2006 | Horii et al. |
| 2009/0285015 | A1 | 11/2009 | Ha et al. |
| 2012/0168907 | A1 | 7/2012 | Malladi et al. |

(Continued)

OTHER PUBLICATIONS

European Patent Office, Extended European Search Report and Opinion issued in European Patent Application No. 23198101.0 on Mar. 13, 2024; 11 pages.

(Continued)

*Primary Examiner* — Jami Valentine Miller
(74) *Attorney, Agent, or Firm* — Thompson Hine LLP; David Cain (57) ABSTRACT

Structures that include bipolar junction transistors and methods of forming such structures. The structure comprises a substrate having a top surface, a trench isolation region in the substrate, and a base layer on the top surface of the substrate. The base layer extending across the trench isolation region. A first bipolar junction transistor includes a first collector in the substrate and a first emitter on a first portion of the first base layer. The first portion of the first base layer is positioned between the first collector and the first emitter. A second bipolar junction transistor includes a second collector in the substrate and a second emitter on a second portion of the first base layer. The second portion of the first base layer is positioned between the second collector and the second emitter.

20 Claims, 5 Drawing Sheets

(56) References Cited

U.S. PATENT DOCUMENTS

| | | | |
|---|---|---|---|
| 2013/0277753 A1 | 10/2013 | Clark, Jr. | |
| 2014/0154857 A1 | 6/2014 | Tilke | |
| 2014/0327111 A1* | 11/2014 | Camillo-Castillo | H10D 62/115 257/586 |
| 2015/0021738 A1* | 1/2015 | Camillo-Castillo | H10D 10/891 438/353 |
| 2015/0123245 A1* | 5/2015 | Benoit | H10D 62/137 257/565 |
| 2016/0163685 A1* | 6/2016 | Jain | H10D 10/821 438/359 |
| 2016/0211345 A1* | 7/2016 | Ding | H10D 62/138 |
| 2017/0287978 A1* | 10/2017 | Toh | G11C 11/161 |
| 2019/0137546 A1* | 5/2019 | Krishnamurthy | H10D 30/669 |
| 2019/0312125 A1* | 10/2019 | Reznicek | H10D 10/021 |
| 2019/0363076 A1* | 11/2019 | Hwang | H10D 89/713 |
| 2020/0381480 A1* | 12/2020 | Reznicek | H10D 62/822 |
| 2023/0275083 A1* | 8/2023 | Malinowski | H10D 30/6735 257/350 |
| 2023/0326919 A1* | 10/2023 | Chiu | H10D 89/711 257/303 |
| 2024/0147736 A1* | 5/2024 | Gopinath | H01L 23/481 |
| 2024/0170560 A1* | 5/2024 | Derrickson | H10D 10/60 |

OTHER PUBLICATIONS

F. Arnaud et al., "High Density Embedded PCM Cell in 28nm FDSOI Technology for Automotive Micro-Controller Applications," 2020 IEEE International Electron Devices Meeting (IEDM), 2020, pp. 24.2.1-24.2.4, doi: 10.1109/IEDM13553.2020.9371934.

F. Disegni et al., "16MB High Density Embedded PCM macrocell for automotive-grade microcontroller in 28nm FD-SOI, featuring extension to 24MB for Over-The-Air software update," 2021 Symposium on VLSI Circuits, 2021, pp. 1-2, doi: 10.23919/VLSICircuits52068.2021.9492465.

F. Disegni et al., "Embedded PCM macro for automotive-grade microcontroller in 28nm FD-SOI," 2019 Symposium on VLSI Circuits, 2019, pp. C204-C205, doi: 10.23919/VLSIC.2019.8778129.

European Patent Office, Decision to Grant a European Patent pursuant to Article 97(1) EPC, issued in European Patent Application No. 23198101.0 on Apr. 17, 2025; 2 pages.

Derrickson, Alexander et al., "Bipolar Junction Transistor Arrays" filed on Nov. 21, 2022 as a U.S. Appl. No. 17/990,898.

European Patent Office, Communication under Rule 71(3) EPC Intent to Grant, issued in European Patent Application No. 23198101.0 on Feb. 7, 2025; 8 pages.

European Patent Office; Decision to Grant a European Patent Pursuant to Article 97(1) EPC issued in European Patent Application No. 23197829.7 on Jan. 8, 2025; 2 pages.

U.S. Patent and Trademark Office; Non-Final Office Action issued in U.S. Appl. No. 17/990,898 on Mar. 27, 2025; 18 pages.

European Patent Office, Extended European Search Report and Opinion issued in European Patent Application No. 23197829.7 on Mar. 5, 2024; 13 pages.

U.S. Patent and Trademark Office; Notice of Allowance issued in U.S. Appl. No. 17/990,898 on Jul. 9, 2025; 14 pages.

U.S. Patent and Trademark Office; Notice of Allowance issued in U.S. Appl. No. 17/990,898 on Aug. 4, 2025; 21 pages.

\* cited by examiner

ARRAY ARRANGEMENTS OF VERTICAL BIPOLAR JUNCTION TRANSISTORS

BACKGROUND

This disclosure relates to integrated circuits and semiconductor device fabrication and, more specifically, to structures that include bipolar junction transistors and methods of forming such structures.

A bipolar junction transistor is a three-terminal electronic device that includes an emitter, a collector, and an intrinsic base defining respective junctions with the emitter and collector. In a PNP bipolar junction transistor, the emitter and collector are comprised of p-type semiconductor material, and the intrinsic base is comprised of n-type semiconductor material. In an NPN bipolar junction transistor, the emitter and collector are comprised of n-type semiconductor material, and the intrinsic base is comprised of p-type semiconductor material. In operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials have different energy bandgaps, which creates heterojunctions. For example, the collector and emitter of a heterojunction bipolar transistor may be constituted by silicon, and the intrinsic base of a heterojunction bipolar transistor may be constituted by silicon-germanium, which is characterized by a narrower band gap than silicon. Heterojunction bipolar transistors may exhibit improvements in high frequency performance as a result of the introduction of heterojunctions.

A resistive random-access memory device provides one type of embedded non-volatile memory technology. A bitcell of a resistive random-access memory device includes a resistive memory element and an access transistor that controls operations used to write, erase, and read the resistive memory element. Because resistive memory elements are non-volatile, bits of data are retained as stored content by the resistive memory elements when the resistive random-access memory device is not powered. The non-volatility of a resistive random-access memory device contrasts with volatile memory technologies, such as a static random-access memory device in which the stored content is eventually lost when unpowered and a dynamic random-access memory device in which the stored content is lost unless periodically refreshed.

Field-effect transistors are commonly used as access transistors in a resistive random-access memory device. Reliable operation of the bitcell of a resistive random-access memory device imposes restrictions on the field-effect transistors. For example, the minimum voltage and drive current requirements imposed on the field-effect transistors restrict the ability to shrink the bitcell dimensions. As a result, the scalability of the bitcell is restricted.

Improved structures that include bipolar junction transistors and methods of forming such structures are needed.

SUMMARY

According to an embodiment of the invention, a structure comprises a substrate having a top surface, a trench isolation region in the substrate, and a base layer on the top surface of the substrate. The base layer extending across the trench isolation region. A first bipolar junction transistor includes a first collector in the substrate and a first emitter on a first portion of the first base layer. The first portion of the first base layer is positioned between the first collector and the first emitter. A second bipolar junction transistor includes a second collector in the substrate and a second emitter on a second portion of the first base layer. The second portion of the first base layer is positioned between the second collector and the second emitter.

According to an embodiment of the invention, a method comprises forming a trench isolation region in a substrate, and forming a base layer on a top surface of the substrate. The base layer extends across the trench isolation region. The method further comprises forming a first bipolar junction transistor including a first collector in the substrate and a first emitter on a first portion of the base layer, and forming a second bipolar junction transistor including a second collector in the substrate and a second emitter on a second portion of the base layer. The first portion of the base layer is positioned between the first collector and the first emitter, and the second portion of the base layer is positioned between the second collector and the second emitter.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

With reference to FIGS. 1, 2, 2A, 3, 3A and in accordance with embodiments of the invention, a structure 10 for a resistive random-access memory device includes an array of bipolar junction transistors 12, 14, 16, 18 that may be fabricated using a substrate 32. The substrate 32 may be comprised of a semiconductor material, such as silicon, and the substrate 32 may be lightly doped with a p-type dopant. In an embodiment, the substrate 32 may be a hybrid region of a silicon-on-insulator substrate from which the device layer and buried oxide layer have been removed. Field-effect transistors (not shown) may be formed using the device layer in a region of the silicon-on-insulator substrate different from the region including the bipolar junction transistors 12, 14, 16, 18.

Wells 34, 36 may be formed as doped regions in the substrate 32. In an embodiment, the wells 34, 36 may be located adjacent to a top surface 31 of the substrate 32. In an embodiment, the wells 34, 36 may longitudinally extend as stripes of doped semiconductor material, and the wells 34, 36 may be aligned along respective longitudinal axes 35, 37, which may be oriented parallel to each other. The wells 34, 36 may be contacted at an edge of the transistor array.

The wells 34, 36 may be formed in the substrate 32 by introducing a dopant by, for example, ion implantation with given implantation conditions. A patterned implantation mask may be formed to define selected areas that are exposed for the implantation of ions. The implantation mask may include a layer of an organic photoresist that is applied and patterned to form openings exposing the selected areas and determining, at least in part, the location and horizontal dimensions of the wells 34, 36. The implantation mask has a thickness and stopping power sufficient to block the implantation of ions in masked areas. The implantation conditions (e.g., ion species, dose, kinetic energy) may be selected to tune the electrical and physical characteristics of the wells 34, 36. In an embodiment, the wells 34, 36 may be doped with a concentration of a p-type dopant (e.g., boron) such that the wells 34, 36 have p-type conductivity.

A well 30 may be positioned in the substrate 32 beneath the wells 34, 36. The wells 34, 36 may be positioned in a vertical direction between the well 30 and the top surface 31 of the substrate 32. The well 30 may have an opposite conductivity type from the wells 34, 36, and may electrically isolate the wells 34, 36 from the portion of the substrate 32 beneath the well 30. In an embodiment, the well 30 may be doped with a concentration of an n-type dopant (e.g., arsenic or phosphorus) such that the well 30 has n-type conductivity.

The well 30 may be formed by introducing a dopant by, for example, ion implantation into the substrate 32. A patterned implantation mask may be formed to define a selected area on the top surface 31 of the substrate 32 that is exposed for the implantation of ions. The implantation mask may include a layer of an organic photoresist that is applied and patterned to form an opening exposing the selected area on the top surface 31 of the substrate 32 and determining, at least in part, the location and horizontal dimensions of the well 30. The implantation mask has a thickness and stopping power sufficient to block the implantation of ions in masked areas. The implantation conditions (e.g., ion species, dose, kinetic energy) may be selected to tune the electrical and physical characteristics of the well 30.

Trench isolation regions 24 may be positioned in the substrate 32. In an embodiment, the trench isolation regions 24 have a top surface that may be coplanar or substantially coplanar with the top surface 31 of the substrate 32. The trench isolation regions 24 may be formed by patterning shallow trenches with lithography and etching processes, depositing a dielectric material, such as silicon dioxide, to fill the shallow trenches, and planarizing and/or recessing the dielectric material. One of the trench isolation regions 24 is positioned between the well 34 and the well 36 to electrically isolate the well 34 from the well 36. The trench isolation regions 24 may penetrate into the well 30.

Base layers 20, 22 are formed on the substrate 32 and the trench isolation regions 24. In an embodiment, the base layers 20, 22 may be laterally-spaced strips that are longitudinally aligned orthogonal to the wells 34, 36 and intersect the wells 34, 36 at different locations. The base layers 20, 22 may extend across the trench isolation region 24 between the wells 34, 36. The bipolar junction transistor 12 includes an intrinsic base represented by a portion of the base layer 20 that adjoins an underlying portion of the well 34, and the underlying adjoined portion of the well 34 may define a collector of the bipolar junction transistor 12. The bipolar junction transistor 14 includes an intrinsic base represented by a portion of the base layer 22 that adjoins an underlying portion of the well 34, and the underlying adjoined portion of the well 34 may define a collector of the bipolar junction transistor 14. The bipolar junction transistor 16 includes an intrinsic base represented by a portion of the base layer 20 that adjoins an underlying portion of the well 36, and the underlying adjoined portion of the well 36 may define a collector of the bipolar junction transistor 16. The bipolar junction transistor 18 includes an intrinsic base represented by a portion of the base layer 22 that adjoins an underlying portion of the well 36, and the underlying adjoined portion of the well 36 may define a collector of the bipolar junction transistor 18. The base layers 20, 22 may be contacted at an edge of the transistor array. The portions of the base layers 20, 22 and the respective adjoined portions of the wells 34, 36 may define p-n junctions.

A portion of the base layer 20 may overlap with the trench isolation region 24 that is longitudinally positioned along the length of the base layer 20 between the respective portions of the base layer 20 representing the intrinsic bases of the bipolar junction transistor 12 and the bipolar junction transistor 16. In an embodiment, this portion of the base layer 20 may directly contact the trench isolation region 24. A portion of the base layer 22 may overlap with the trench isolation region 24 that is longitudinally positioned along the length of the base layer 22 between the respective portions of the base layer 22 representing the intrinsic bases of the bipolar junction transistor 14 and the bipolar junction transistor 18. In an embodiment, this portion of the base layer 22 may directly contact the trench isolation region 24.

The base layers 20, 22 may be formed depositing and patterning a semiconductor layer with lithography and etching processes to define strips of semiconductor material. In an embodiment, the base layers 20, 22 may be comprised of a semiconductor material that is doped to have an opposite conductivity type from the doped regions providing the wells 34, 36. In an embodiment, the base layers 20, 22 may be comprised of silicon. In an embodiment, the base layers 20, 22 may be comprised of silicon-germanium. In an embodiment, the base layers 20, 22 may be comprised of silicon-germanium containing a germanium content of less than or equal to than 35 atomic percent and the balance silicon. In an embodiment, the base layers 20, 22 may be doped with a concentration of an n-type dopant (e.g., arsenic or phosphorus) such that the base layers 20, 22 have n-type conductivity. The base layers 20, 22 may be aligned along respective longitudinal axes 21, 23, which may be oriented parallel to each other and orthogonal to the longitudinal axes 35, 37 of the wells 34, 36.

The bipolar junction transistor 12 includes an emitter 40 that adjoins a portion of the base layer 20 along an interface defining a p-n junction. The adjoined underlying portion of the base layer 20 is positioned between the well 34 and the emitter 40. The bipolar junction transistor 14 includes an emitter 42 that adjoins a portion of the base layer 22 along an interface defining a p-n junction. The adjoined underlying portion of the base layer 22 is positioned between the well 34 and the emitter 42. The bipolar junction transistor 16 includes an emitter 44 that adjoins a portion of the base layer 20 along an interface defining a p-n junction. The adjoined underlying portion of the base layer 20 is positioned between the well 34 and the emitter 44. The bipolar junction transistor 18 includes an emitter 46 that adjoins a portion of the base layer 22 along an interface defining a p-n junction. The adjoined underlying portion of the base layer 22 is positioned between the well 34 and the emitter 46.

The emitters 40, 42, 44, 46 may be respectively formed as raised semiconductor layers on the base layers 20, 22 at the intersections between the base layers 20, 22 and the wells 34, 36. Respective portions of the base layers 20, 22 defining the intrinsic bases are positioned in a vertical direction between the portions of the wells 34, 36 defining the collectors and the emitters 40, 42, 44, 46. The emitters 40, 42, 44, 46 may be formed by epitaxially growing semiconductor material with a non-selective epitaxial growth process and patterning the semiconductor material with lithography and etching processes. In an embodiment, the semiconductor material of the emitters 40, 42, 44, 46 may be doped to have the same conductivity type as the wells 34, 36 and an opposite conductivity type from the base layers 20, 22. In an embodiment, the semiconductor material of the emitters 40, 42, 44, 46 may be doped with a concentration of a p-type dopant (e.g., boron) such that the emitters 40, 42, 44, 46 have p-type conductivity. In an embodiment, the emitters 40, 42, 44, 46 may have respective lower portions adjacent to the base layers 20, 22 that are lightly doped and respective upper portions that are heavily doped.

Spacers 48 may be arranged on sidewalls of the emitters 40, 42, 44, 46 and the base layers 20, 22. The spacers 48 may be formed by conformally depositing a layer comprised of a dielectric material and etching the deposited layer with an anisotropic etching process. The spacers 48 may be comprised of a dielectric material that is an electrical insulator, such as silicon nitride or a low-k dielectric material characterized by a dielectric constant less than the dielectric constant of silicon nitride. Caps 50, which be sections of a hardmask used to pattern the emitters 40, 42, 44, 46, may be positioned on the top surface of each of the emitters 40, 42, 44, 46. The caps 50 may be comprised of a dielectric material, such as silicon nitride, that is an electrical insulator.

Raised semiconductor layers 26 are formed on the sections of the base layers 20, 22 that are not covered by the emitters 40, 42, 44, 46 and spacers 48. The raised semiconductor layers 26 may be formed by epitaxially growing a semiconductor material (e.g., single-crystal silicon) and then patterning the semiconductor material. In an embodiment, the semiconductor material of the raised semiconductor layers 26 may be doped to have the same conductivity type as the base layers 20, 22. In an embodiment, the semiconductor material of the raised semiconductor layers 26 may be doped (e.g., heavily doped) with a concentration of an n-type dopant (e.g., phosphorus or arsenic) such that the semiconductor layers 26 have n-type conductivity. A silicide layer (not shown) may be formed on the raised semiconductor layers 26, as well as on the emitters 40, 42, 44, 46 after removing the caps 50.

Figure 1:
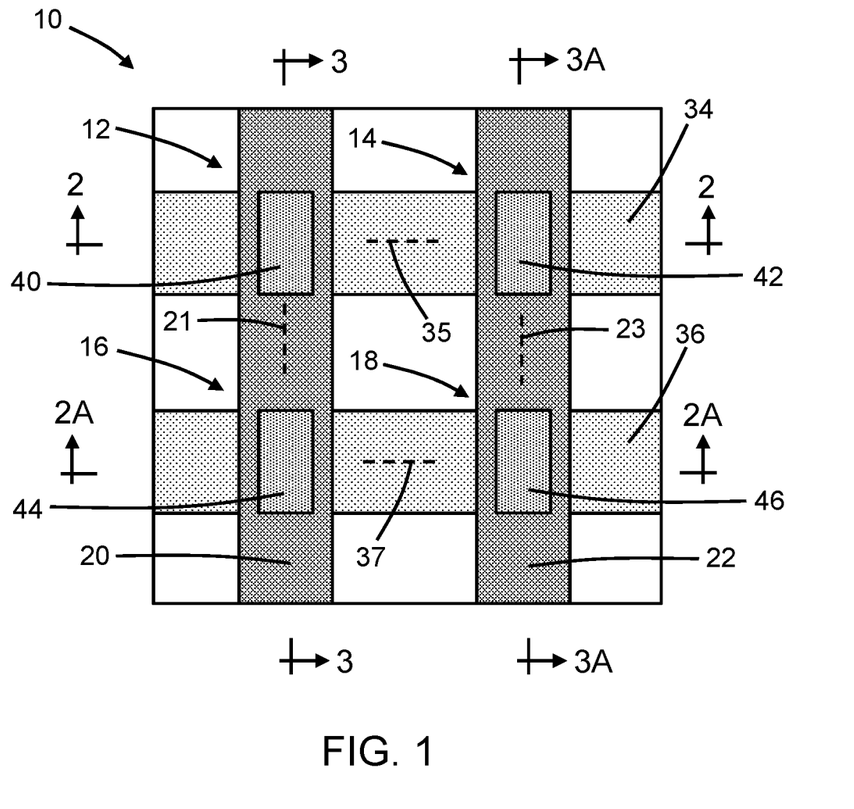
FIG. 1 is a diagrammatic top view illustrating a structure including an array of bipolar junction transistors at an initial stage of a fabrication method in accordance with embodiments of the invention.
Figure 2:
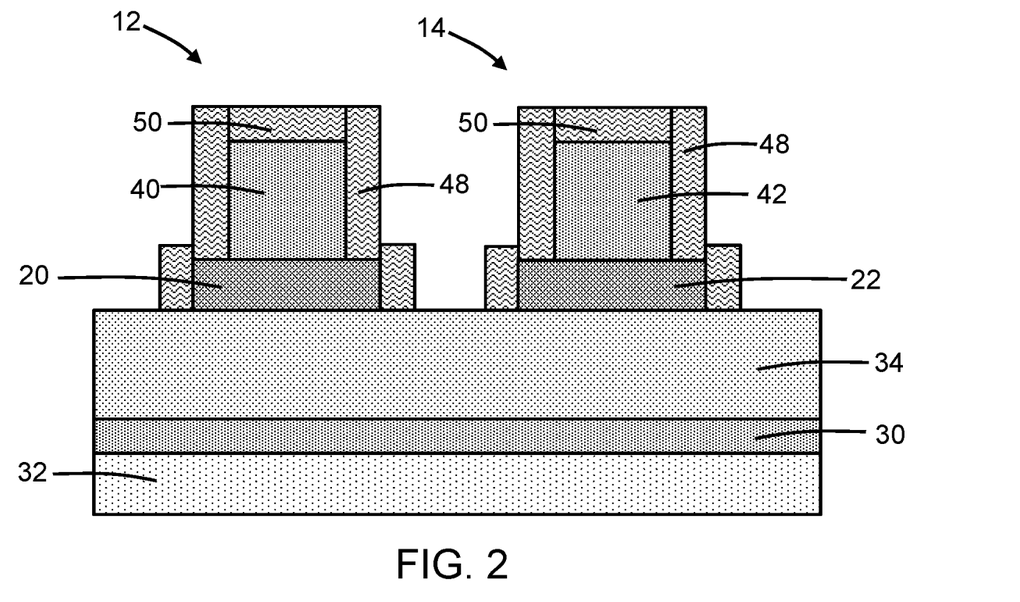
FIG. 2 is a cross-sectional view taken generally along line 2-2 in FIG. 1.
Figure 2A:
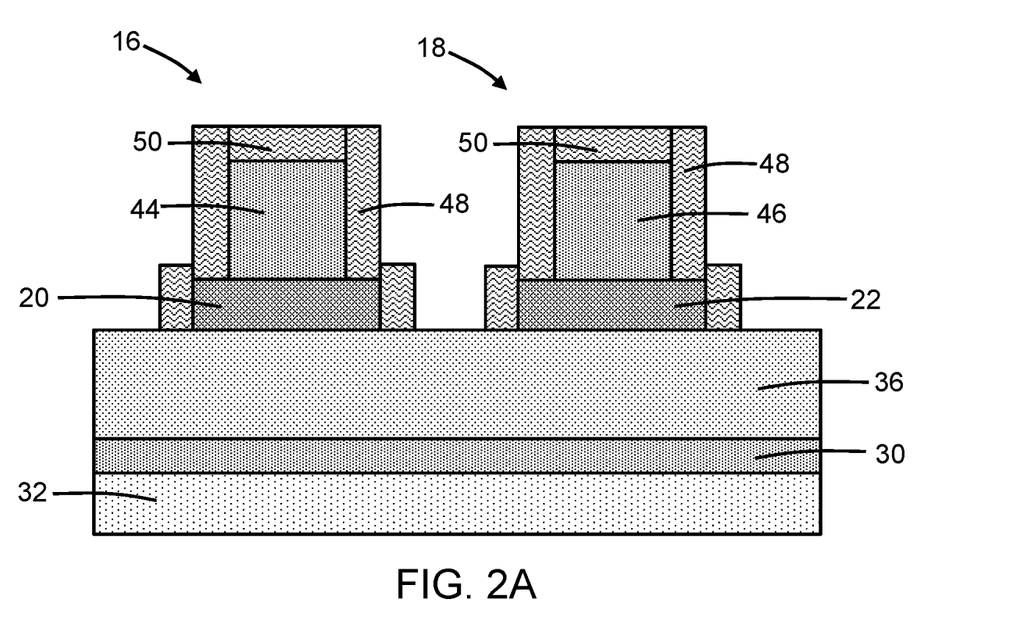
FIG. 2A is a cross-sectional view taken generally along line 2A-2A in FIG. 1.
Figure 3:
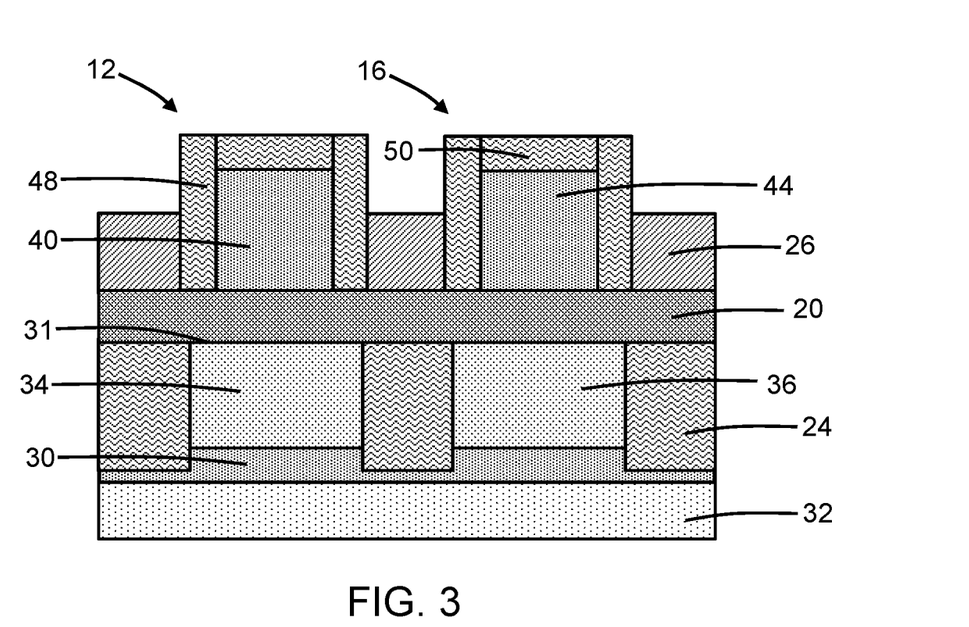
FIG. 3 is a cross-sectional view taken generally along line 3-3 in FIG. 1.
Figure 3A:
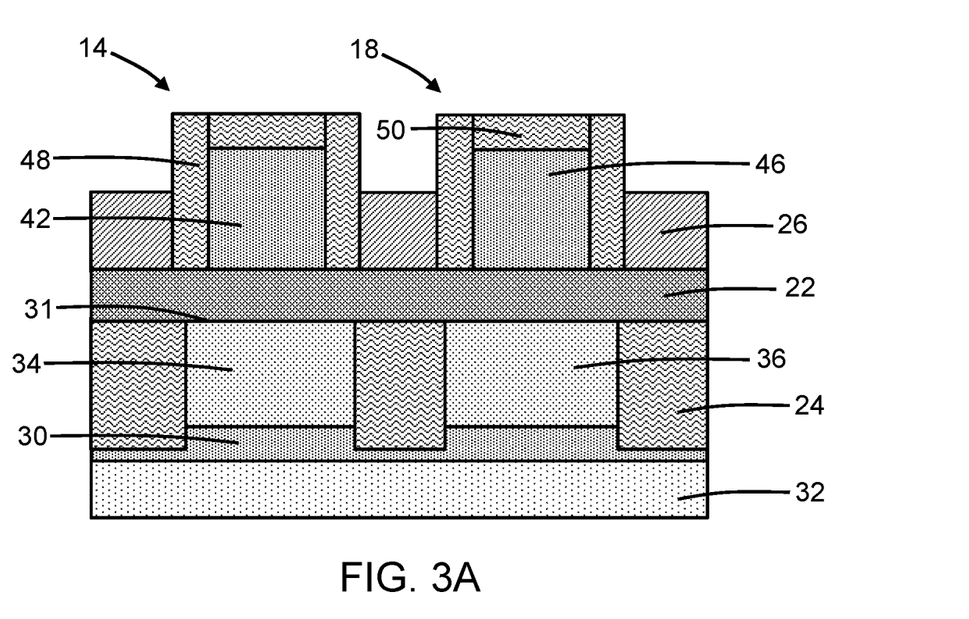
FIG. 3A is a cross-sectional view taken generally along line 3A-3A in FIG. 1.

The structure 10 may formed in a BiCMOS process flow with a minimal number of added masks. For example, the formation of the emitters 40, 42, 44, 46 may be shared with the formation of the gates of field-effect transistors formed on the same chip as the bipolar junction transistors 12, 14, 16, 18. The bipolar junction transistors 12, 14, 16, 18, which have a vertical arrangement of p-n junctions, may have a more compact size than field-effect transistors, which may permit downward scaling in the dimensions of an associated resistive random-access memory device due to the elimination of field-effect transistors as access transistors.

Figure 4:
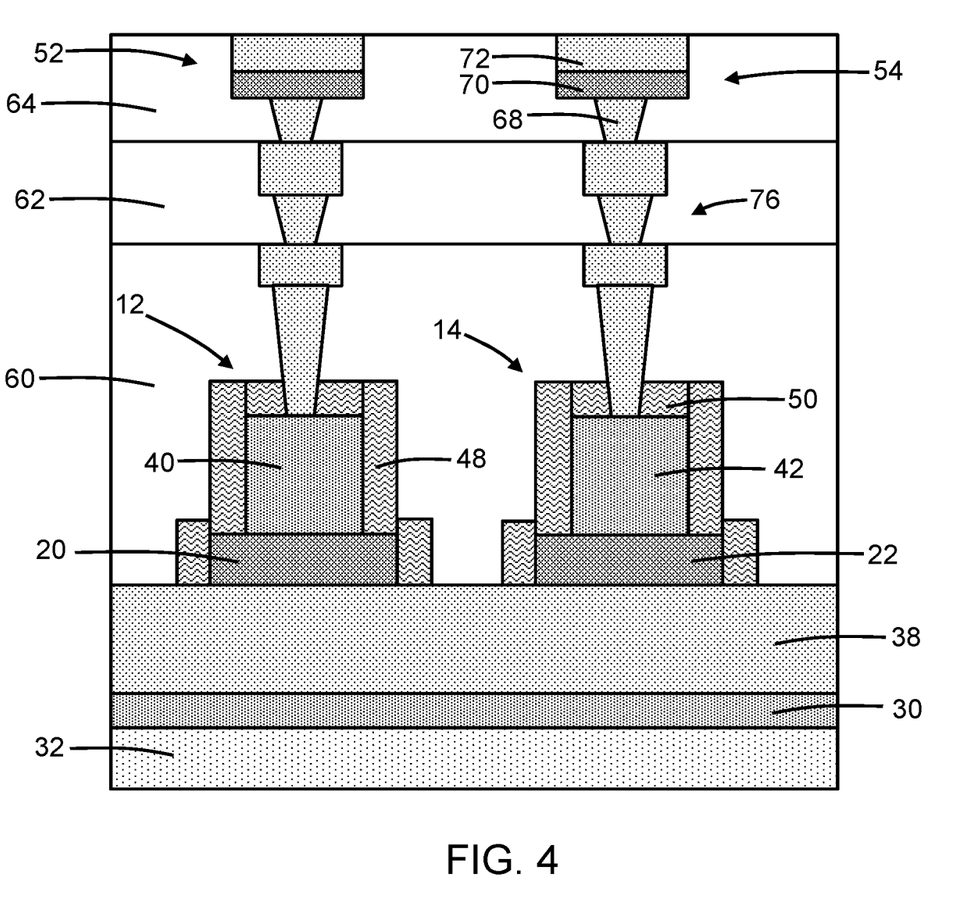
FIGS. 4, 4A are cross-sectional views of the structure at a fabrication stage subsequent to FIG. 1.
Figure 4A:
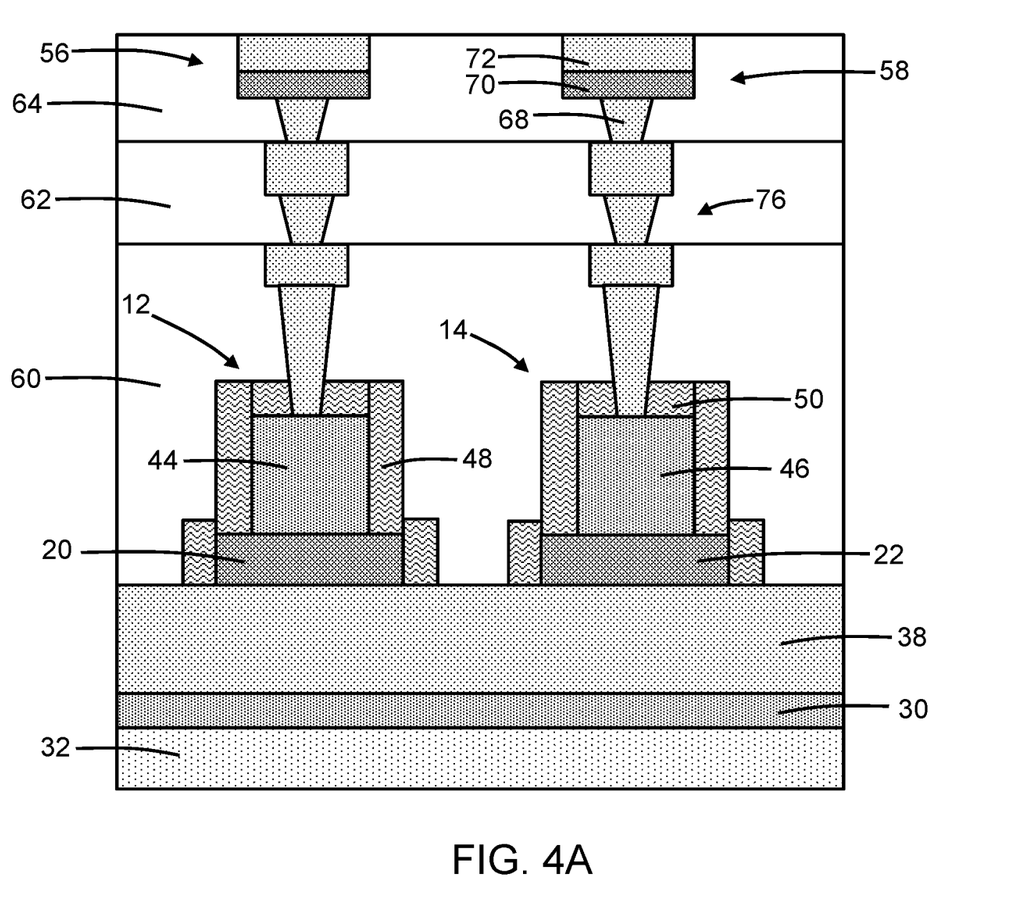

With reference to FIG. 4, 4A in which like reference numerals refer to like features in FIGS. 2, 2A and at a fabrication stage subsequent to FIG. 1, an interconnect structure may be formed over the bipolar junction transistors 12, 14, 16, 18. The interconnect structure may include dielectric layers 60, 62, 64 arranged in a layer stack defining multiple metallization levels. The dielectric layers 60, 62, 64 may be comprised of a dielectric material that is an electrical insulator, such as silicon dioxide or a low-k dielectric material. The dielectric material of the dielectric layer 60 may fill the space between the base layers 20, 22 and the spaces around the emitters 40, 42, 44, 46.

Resistive memory elements 52, 54, 56, 58 may be formed as representative non-volatile memory elements in the interconnect structure. The resistive memory elements 52, 54, 56, 58 are respectively coupled to the bipolar junction transistors 12, 14, 16, 18 to define different bitcells of the resistive random-access memory device, and the bipolar junction transistors 12, 14, 16, 18 provide access transistors for accessing the bitcells. The well 34 may define a word line of the resistive random-access memory device for accessing the bipolar junction transistors 12, 14, and the well 36 may define another word line of the resistive random-access memory device for accessing the bipolar junction transistors 16, 18. The wells 34, 36 may be connected by a bus to peripheral circuits that include, for example, word line drivers. The base layers 20, 22 may define bit lines of the resistive random-access memory device. The base layers 20, 22 may be connected by a bus to peripheral circuits that include, for example, bit line drivers, a multiplexer, and a sense amplifier. The bit lines defined by the base layers 20, 22 may be aligned orthogonal to the word lines defined by the wells 34, 36, which enables connections to be established at edges of the array to the bipolar junction transistors 12, 14, 16, 18 for reading, writing, and erasing the resistive memory elements 52, 54, 56, 58.

The resistive memory elements 52, 54, 56, 58 may arranged in an array that is characterized by rows and columns and that may be spatially coordinated with the array of bipolar junction transistors 12, 14, 16, 18. Each of the resistive memory elements 52, 54, 56, 58 includes a bottom electrode 68, a top electrode 72, and a switching layer 70 positioned between the bottom electrode 68 and the top electrode 72. The bottom electrodes 68 may define respective cathodes of the resistive memory elements 52, 54, 56, 58, and the top electrodes 72 may define respective anodes of the resistive memory elements 52, 54, 56, 58. Each bottom electrode 68 comprised of a metal, such as tantalum, titanium nitride, tantalum nitride, or a combination thereof. Each switching layer 70 may be comprised of a metal oxide, such as hafnium oxide, magnesium oxide, tantalum oxide, titanium oxide, or aluminum oxide, or a dielectric material, such as silicon nitride or silicon dioxide. Each top electrode 72 may be comprised of a metal, such as tungsten, titanium nitride, tantalum nitride, or platinum. The interconnect structure may include vertical interconnections 76 defined by a stack of contacts, via plugs, and metal features that physically and electrically connect the emitter 40 of the bipolar junction transistor 12 to the bottom electrode 68 of the resistive memory element 52, the emitter 42 of the bipolar junction transistor 14 to the bottom electrode 68 of the resistive memory element 54, the emitter 44 of the bipolar junction transistor 16 to the bottom electrode 68 of the resistive memory element 56, and the emitter 46 of the bipolar junction transistor 18 to the bottom electrode 68 of the resistive memory element 58. The vertical interconnections 76 may also include contacts coupled to the wells 34, 36 at an edge of the array and contacts coupled to the silicide layer on the raised semiconductor layers 26 on the base layers 20, 22 at another edge of the array.

The structure 10 for the resistive random-access memory device may be expanded to include additional bipolar junction transistors and additional resistive memory elements. In that regard, the expanded array may include additional wells arranged adjacent to the wells 34, 36, additional base lines arranged adjacent to the base layers 20, 22, and additional emitters at the intersections of the additional base lines and additional wells. The number of resistive memory elements in the expanded array may be increased commensurate with the increased number of bipolar junction transistors. In an alternative embodiment, the resistive memory elements 52, 54, 56, 58 may be replaced by different non-volatile memory elements, such as magnetoresistive memory elements.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a substrate having a top surface;
a first trench isolation region in the substrate;
a first base layer on the top surface of the substrate, the first base layer extending across the first trench isolation region;
a first bipolar junction transistor including a first collector in the substrate and a first emitter on a first portion of the first base layer, the first portion of the first base layer positioned between the first collector and the first emitter;
a second bipolar junction transistor including a second collector in the substrate and a second emitter on a second portion of the first base layer, the second portion of the first base layer positioned between the second collector and the second emitter;
a first well in the substrate; and
a second well in the substrate,
wherein the first collector is a portion of the first well, and the second collector is a portion of the second well.

2. The structure of claim 1 wherein the first trench isolation region is positioned in the substrate between the first well and the second well.

3. The structure of claim 1 further comprising:
a third well in the substrate, the third well have an opposite conductivity type from the first well and the second well,
wherein the first well and the second well are positioned between the third well and the top surface of the substrate, and the first trench isolation region penetrates into the third well.

4. The structure of claim 3 wherein the first well adjoins the third well, and the second well adjoins the third well.

5. The structure of claim 1 wherein the first well, the second well, the first emitter, and the second emitter have p-type conductivity, and the first base layer has n-type conductivity.

6. The structure of claim 1 wherein the first base layer is a strip comprising a semiconductor material, and the first well and the second well are longitudinally aligned orthogonal to the strip.

7. A structure comprising:
a substrate having a top surface;
a first trench isolation region in the substrate;
a first base layer on the top surface of the substrate, the first base layer extending across the first trench isolation region;
a first bipolar junction transistor including a first collector in the substrate and a first emitter on a first portion of the first base layer, the first portion of the first base layer positioned between the first collector and the first emitter;
a second bipolar junction transistor including a second collector in the substrate and a second emitter on a second portion of the first base layer, the second portion of the first base layer positioned between the second collector and the second emitter;
a second trench isolation region in the substrate; and
a second base layer on the top surface of the substrate, the second base layer extending across the second trench isolation region.

8. The structure of claim 7 further comprising:
a third bipolar junction transistor including a third collector in the substrate and a third emitter on a first portion of the second base layer, the first portion of the second base layer positioned between the third collector and the third emitter.

9. The structure of claim 8 further comprising:
a fourth bipolar junction transistor including a fourth collector in the substrate and a fourth emitter on a second portion of the second base layer, the second portion of the second base layer positioned between the fourth collector and the fourth emitter.

10. The structure of claim 7 wherein the first base layer is a first strip comprising a semiconductor material, the second base layer is a second strip comprising the semiconductor material, and the second strip is longitudinally aligned parallel to the first strip.

11. The structure of claim 7 wherein the first base layer and the second base layer comprise silicon-germanium including an n-type dopant.

12. The structure of claim 7 further comprising:
a first well in the substrate; and
a second well in the substrate,
wherein the first collector is a portion of the first well, the second collector is a portion of the second well, the first well is aligned orthogonal to the first base layer and the second base layer, and the second well is aligned orthogonal to the first base layer and the second base layer.

13. The structure of claim 1 further comprising:
an interconnect structure over the first bipolar junction transistor and the second bipolar junction transistor, the interconnect structure including a plurality of dielectric layers in a layer stack,
a first memory element in the interconnect structure, the first memory element connected to the first emitter of the first bipolar junction transistor; and
a second memory element in the interconnect structure, the second memory element connected to the second emitter of the second bipolar junction transistor.

14. The structure of claim 13 wherein the first memory element and the second memory element each include a first electrode, a second electrode, and a switching layer positioned between the first electrode and the second electrode.

15. The structure of claim 1 wherein the first trench isolation region is substantially coplanar with the top surface of the substrate.

16. The structure of claim 1 wherein the first base layer includes a third portion longitudinally arranged between the first portion and the second portion, and the third portion of the first base layer overlaps with the first trench isolation region.

17. The structure of claim 16 wherein the third portion of the first base layer directly contacts the first trench isolation region.

18. A method comprising:
forming a trench isolation region in a substrate;
forming a first well in the substrate;
forming a second well in the substrate;
forming a base layer on a top surface of the substrate, wherein the base layer extends across the trench isolation region;
forming a first bipolar junction transistor including a first collector in the substrate and a first emitter on a first portion of the base layer, wherein the first portion of the base layer is positioned between the first collector and the first emitter; and
forming a second bipolar junction transistor including a second collector in the substrate and a second emitter on a second portion of the base layer, wherein the second portion of the base layer is positioned between the second collector and the second emitter,
wherein the first collector is a portion of the first well, and the second collector is a portion of the second well.

19. The structure of claim 1 further comprising:
a second trench isolation region in the substrate; and
a second base layer on the top surface of the substrate, the second base layer extending across the second trench isolation region.

20. The structure of claim 7 further comprising:
an interconnect structure over the first bipolar junction transistor and the second bipolar junction transistor, the interconnect structure including a plurality of dielectric layers in a layer stack;
a first memory element in the interconnect structure, the first memory element connected to the first emitter of the first bipolar junction transistor; and
a second memory element in the interconnect structure, the second memory element connected to the second emitter of the second bipolar junction transistor.

* * * * *